Oct. 27, 1970 D. E. SANDERS 3,536,933

HIGH SPEED DIVIDE-BY-TWO DUAL TRANSISTOR CIRCUIT

Filed Aug. 24, 1967

INVENTOR.
DAVID E. SANDERS
BY
Hopgood & Calimafde
ATTORNEYS

United States Patent Office 3,536,933
Patented Oct. 27, 1970

3,536,933

HIGH SPEED DIVIDE-BY-TWO DUAL TRANSISTOR CIRCUIT

David E. Sanders, Kenneth City, Fla., assignor to Electronic Communications, Inc.

Filed Aug. 24, 1967, Ser. No. 663,105
Int. Cl. H03k *21/00, 23/08*
U.S. Cl. 307—220 1 Claim

ABSTRACT OF THE DISCLOSURE

A high speed divide-by-two circuit operable in the 200 mHz. to 400 mHz. frequency range comprising a pair of transistors having their emitters fed in common by the input and their bases and collectors cross-coupled via a pair of capacitors. The transistor collectors are further coupled by a pair of serial transformer windings sensed to invert and cross-couple the voltages appearing thereon.

BACKGROUND OF THE INVENTION

Conventional circuits, capable of frequency division by two in the UHF band, are either narrow band or they require specially shaped wave forms at the input. Additionally, these circuits generally constitute a large number of components and dissipate an excessive amount of power.

Typical circuits capable of frequency division below the UHF band include a pair of transistors arranged to divide by two in a configuration referred to as current-mode flip-flop with emitter triggering. With this arrangement, the bases and collectors of a pair of transistors are cross-coupled first by a pair of capacitors and second through resistors connected to the collectors. As the frequency increases, however, the propagation delay from transistor base to collector becomes significant resulting in an inability of the transistors to follow the input and divide by two.

It is the object of this invention to provide a circuit which will divide an input frequency in 200 mHz. to 400 mHz. band by two, simply without elabroate circuitry, and without requiring devices of close tolerance.

It is a further object of this invention to provide a device which satisfies the foregoing object and which will accept sine, square and pulse wave inputs.

It is a further object of this invention to provide a divide-by-two circuit capable of operation in low impedance transmission line systems.

It is a further object of this invention to provide a circuit which may be made to operate at lower frequencies by the smiple modification of its circuit parameters.

It is a still further object of this invention to provide a circuit arrangement which is capable of being redundantly cascaded in order to divide by two to the desired power.

SUMMARY OF THE INVENTION

Briefly, the invention is predicated upon the concept of employing a wideband transformer as the collector loads of a pair of cross-coupled transistors which are emitter triggered with the input wave to be devided. The wideband transformer enables each transistor to regenerate without waiting for the propagation delay of the other transistor.

The above mentioned and other features and objects of this invention and the manner of attaining them will become more apparent and the invention itself will best be understood by reference to the following description of an embodiment of the invention taken in conjunction with the accompanying drawings, the description of which follows.

DETAILED DESCRIPTION OF THE INVENTION

The input signal to be divided in half is simultaneously coupled to the emitters of transistors $Q_1$ and $Q_2$ via an impedance matching T-pad comprising resistors $R_2$, $R_3$ and $R_4$ and D.C. blocking capacitor $C_3$. The pad would preferably be omitted if the circuits are redundantly coupled in tandem to divide by a number greater than two (i.e., $2^n$ where $n$ is any integer).

Power is provided to the transistor bases by voltage source —V via biasing resistors $R_5$, $R_6$, $R_7$ and $R_8$ and to the transistor emitters via resistor $R_9$ and choke $L_1$. Feed through capacitors $C_4$, $C_5$ and $C_6$ decouple any high frequency component that might otherwise leak through to the transistors.

Turning now to the operation of the circuit, the input signal is simultaneously applied to the emitters of transistors $Q_1$ and $Q_2$. Since the parameters of the transistors as well as the voltages applied thereto are not precisely identical, the base of one transistor will be more positive than the base of the other, causing it to flip first. The difference may be only a few millivolts.

Figure 1:
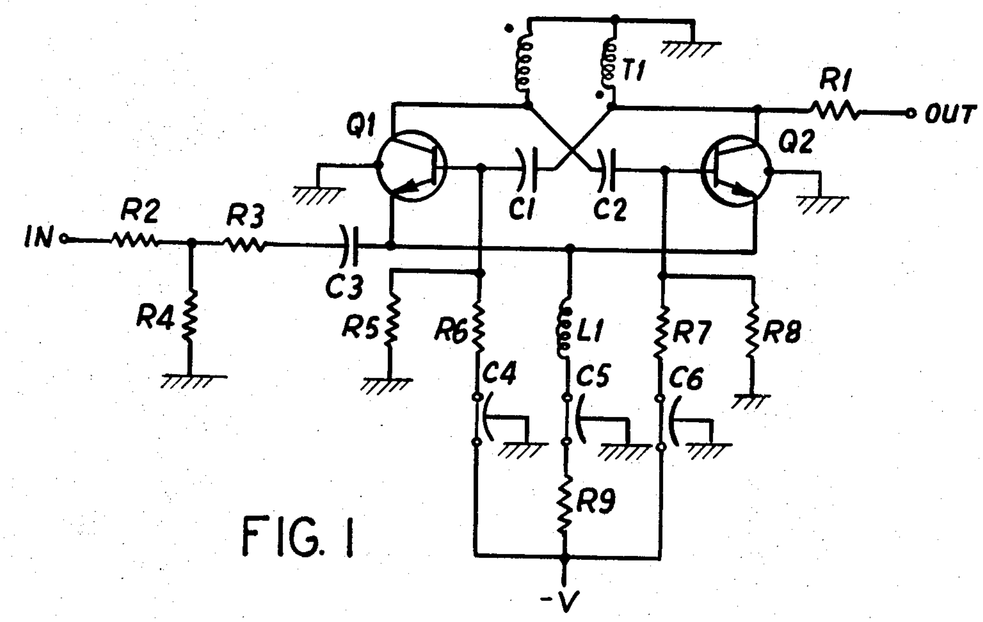
FIG. 1 is a schematic illustration of the UHF divide-by-two circuit of the invention.
Figure 2:
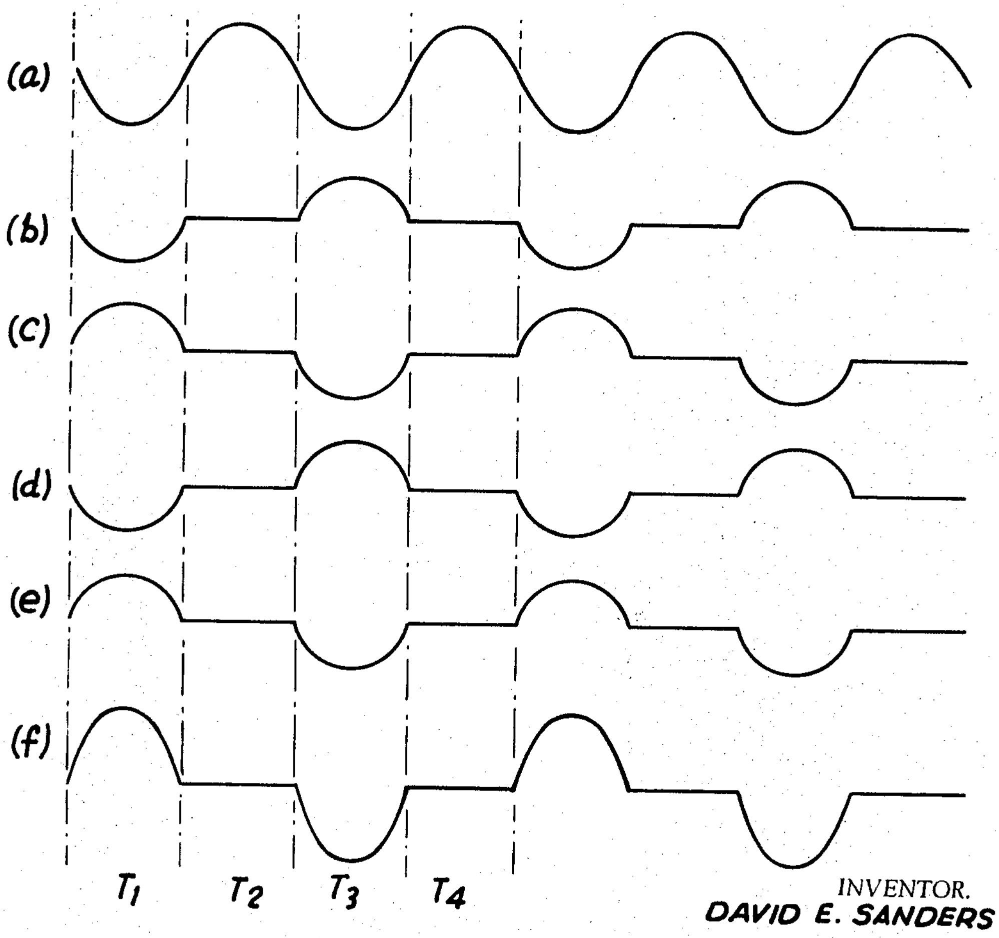
FIG. 2 illustrates waveforms occurring at predetermined points in the circuit of FIG.1.

To expand upon the foregoing, reference will be made to FIG. 2 wherein FIG. 2*a* illustrates the input waveform; FIG. 2*b* the waveform at the collector of transistor $Q_1$; FIG. 2*c* the waveworm at the collector of transistor $Q_2$; FIG. 2*d* the waveform at the base of transistor $Q_2$; FIG. 2*e* the waveform at the base of transistor $Q_1$; and FIG. 2*f* the waveform of the output.

During the first half of time $T_1$, assuming that the base of transistor $Q_1$ was more positive than the base of transistor $Q_2$ due to slight differences in their parameters, $Q_1$ will start conducting harder than $Q_2$. That is, while both transistors will be switched on by the input pulse, transistor $Q_1$ will switch on faster and conduct greater current. As transistor $Q_1$ goes more negative, following the input, it will apply a negative voltage to the base of transistor $Q_2$ via capacitor $C_2$ tending to cut transistor $Q_2$ off. Simultaneously, because of the sense of the transformer coupling, the negative output on the collector of transistor $Q_1$ will be coupled as a positive output to the output resistor $R_1$. This will in turn couple back through capacitor $C_1$ to the base of transistor $Q_1$, making it conduct harder and locking this transistor on, without having to wait for the propagation delay through transistor $Q_2$.

During the second half of time $T_1$, the negative voltage appearing at the collector of transistor $Q_1$ reduces due to a reduced input, and the output positive voltage likewise reduces.

During time $T_2$ the input voltage goes positive, and drives both emitters of transistors $Q_1$ and $Q_2$ positive. $Q_1$ shuts down as soon as its emitter becomes more positive than its base; $Q_2$, it is recalled, is already off. Both transistors remain off for period $T_2$.

As it cuts off the transistors, the transformer $T_1$ tends to carry the collector of transistor $Q_1$ slightly more positive than the collector of transistor $Q_2$. Since the collector of transistor $Q_1$ is coupled via capacitor $C_2$ to the base of transistor $Q_2$, then as the input signal again goes negative (time $T_3$) transistor $Q_2$ will turn on first, making the collector of transistor $Q_2$, as well as the output, go negative and applying this negative signal to the base of transistor $Q_1$ via capacitor $C_1$. At the same time, the transformer coupling makes the collector of transistor $Q_1$ go positive and cross couples the positive signal back to the base of transistor $Q_2$, thereby locking transistor $Q_2$ on and shutting transistor $Q_1$ off. The remainder of time $T_3$ and time $T_4$ is similar to that explained above with respect to time $T_1$ and time $T_2$ with the roles of transistors $Q_1$ and $Q_2$ being reversed.

The resultant output signal is shown in FIG. 2*f* where it may be seen that the frequency is one-half that of the input signal 2*a*. The described circuit may be easily modified to operate at lower frequencies by increasing the values of capacitors $C_1$, $C_2$ and $C_3$.

Parameters of an exemplary circuit operable in the 200 to 400 mHz. UHF band are given below.

| | |
|---|---|
| $R_1$ | 27 ohms. |
| $R_2$ and $R_3$ | 15 ohms. |
| $R_4$ | 82 ohms. |
| $R_5$ through $R_9$ | 470 ohms. |
| $C_1$ and $C_2$ | 15 pf. |
| $C_3$ | 10 pf. |
| $C_4$ through $C_6$ | 500 pf. feedthru. |
| Transistors $Q_1$ and $Q_2$ | 2N2857. |
| V | −13 volts. |
| $T_1$ | "Ferrox-cube" core 1 turn No. 36 bifilar wire, 2 turns total. |
| $L_1$ | "Ferrox-cube" core 6 turns No. 36 bifilar wire. |

While the principles of the invention have been described in connection with specific apparatus, it is to be clearly understood that this description is made only by way of example and not as a limitation to the scope of the invention as set forth in the objects thereof and in the accompanying claim.

What is claimed is:

1. A high speed divide-by-two circuit comprising:

a pair of transistors, each having collector, emitter and base electrodes, an input coupled in common to the emitter electrodes of each of said transistors, a pair of capacitors connecting the respective collector electrode of each transistor to the base electrode of the other transistor;

a transformer having two windings one end of each of which is grounded, the first winding being coupled at the other end to one of said capacitors and one transistor collector electrode and the other winding being coupled at the other end to the other of said capacitors and the other transistor collector electrode, said windings being sensed to invert the voltages appearing at the respective capacitors; and an output connected to the collector electrode of one of said transistors.

References Cited

UNITED STATES PATENTS 3,144,565 8/1964 Coffey ............ 307—282

FOREIGN PATENTS 1,036,920 8/1958 Germany.

DONALD FORRER, Primary Examiner

S. D. MILLER, Assistant Examiner

U.S. Cl. X.R.

307—225; 328—25, 30; 331—113